(12) United States Patent
Aipperspach et al.

(10) Patent No.: US 7,729,188 B2
(45) Date of Patent: Jun. 1, 2010

(54) METHOD AND CIRCUIT FOR IMPLEMENTING ENHANCED EFUSE SENSE CIRCUIT

(75) Inventors: Anthony Gus Aipperspach, Rochester, MN (US); Phil Christopher Felice Paone, Rochester, MN (US); Brian Joy Reed, Rochester, MN (US); David Edward Schmitt, Rochester, MN (US); Gregory John Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 267 days.

(21) Appl. No.: 12/029,010

(22) Filed: Feb. 11, 2008

(65) Prior Publication Data

US 2009/0201756 A1 Aug. 13, 2009

(51) Int. Cl.
*G11C 7/00* (2006.01)
(52) U.S. Cl. ............... 365/205; 365/225.7; 365/189.09; 365/189.11
(58) Field of Classification Search ............ 365/205, 365/225.7, 189.09, 189.11, 207
See application file for complete search history.

(56) References Cited

U.S. PATENT DOCUMENTS 6,956,781 B2 * 10/2005 Oyama ............... 365/207

OTHER PUBLICATIONS

U.S. Appl. No. 11/622,519, filed Jan. 12, 2007 by Anthony Gus Aipperspach et al., entitled Method and Apparatus for Implementing eFuse Sense Amplifier Testing Without Blowing the eFuse.

* cited by examiner

*Primary Examiner*—David Lam
(74) *Attorney, Agent, or Firm*—Joan Pennington

(57) ABSTRACT

A method and circuit for implementing an eFuse sense amplifier, and a design structure on which the subject circuit resides are provided. A sensing circuit includes a pair of cross-coupled inverters, each formed by a pair of series connected P-channel field effect transistors (PFETs) and an N-channel field effect transistor (NFET). A first pull-up resistor is coupled between a positive voltage supply rail and a first sensing node of the sensing circuit. A second pull-up resistor is coupled between a positive voltage supply rail and a second sensing node of the sensing circuit. A first bitline is coupled to the first sensing node of the sensing circuit and a second bitline coupled to the second sensing node of the sensing circuit. One of a respective reference resistor and a respective eFuse cell is selectively coupled to the first bitline and the second bitline.

20 Claims, 8 Drawing Sheets

US 7,729,188 B2

METHOD AND CIRCUIT FOR IMPLEMENTING ENHANCED EFUSE SENSE CIRCUIT

FIELD OF THE INVENTION

The present invention relates generally to the data processing field, and more particularly, relates to a method and circuit for implementing an enhanced eFuse sense amplifier, and a design structure on which the subject circuit resides.

DESCRIPTION OF THE RELATED ART

Electronic Fuses (eFuses) are currently used to configure elements after the silicon masking and fabrication process. These fuses typically are used to configure circuits for customization or to correct silicon manufacturing defects and increase manufacturing yield.

In very large scale integrated (VLSI) chips, it is common to have fuses, such as eFuses that can be programmed for various reasons. Among these reasons include invoking redundant elements in memory arrays for repairing failing locations or programming identification information.

As used in the following description and claims, it should be understood that the term eFuse means a non-volatile storage element that includes either an antifuse, which is a programmable element that provides an initial high resistance and when blown provides a selective low resistance or short circuit; or a fuse, which is a programmable element that provides an initial low resistance and when blown provides a selective high resistance or open circuit.

U.S. patent application Ser. No. 11/622,519 filed Jan. 12, 2007 discloses a sense amplifier illustrated in FIG. 1, which provided improvements over many prior art arrangements.

Referring to FIG. 1, there is shown a prior art sense amplifier 100 used for sensing an electronic fuse, or eFuse 102 to determine if the fuse 102 is a logical "0" or logical "1". The fuse 102 stores information by electrically changing the resistance of a polysilicon resistor. Sense amplifier 100 includes true and complement sensing nodes respectively labeled S_T and S_C. A first precharge P-channel field effect transistor (PFET) 104 is connected between a positive voltage supply rail VDD and the true sensing node S_T that is connected via a pair of series connected N-channel field effect transistor (NFETs) 106, 108 to the eFuse 102. A second precharge P-channel field effect transistor (PFET) 110 is connected between the positive voltage supply rail VDD and the complement sensing node S_C that is connected via a pair of series connected N-channel field effect transistor (NFETs) 112, 114 to a reference resistor 116.

Sense amplifier 100 includes a pair of cross-coupled inverters connected to the true and complement sensing nodes S_T and S_C, as shown. A PFET 120 and an NFET 122, and a PFET 124 and an NFET 126 respectively form the cross-coupled inverters. A pull-up PFET 128 connects PFETs 120, 124 to the positive voltage supply rail VDD and a pull-down NFET 130 connects NFETs 122, 126 to ground. The eFuse 102 and reference resistor 116 are connected to a common node labeled FSOURCE and a connected via a pair of series connected N-channel field effect transistor (NFETs) 140, 142 to ground. A fuse programming circuit coupled to the eFuse 102 includes a NAND gate 150 receiving two inputs, BLOW_FUSE, FUSE_SOLUTION and providing an output applied to an inverter 152, and a pair of series connected N-channel field effect transistor (NFETs) 154, 156 connected between the eFuse 102 to ground.

When an eFuse is blown the final resistance of the eFuse has a distribution depending upon how well electromigration has occurred. How well electromigration occurs depends upon the amount voltage across the eFuse and amount of current through the eFuse.

Due to process, voltage, and current variation typically when an eFuse does not blow correctly results in a resistance, which is lower than expected. This lower resistance causes a problem in the ability to accurately sense if an eFuse is blown or not. Lower resistance of a blown eFuse is also a reliability concern.

In order to determine the state of an eFuse, an improved sense amplifier circuit is needed that will be able to determine if an eFuse is in its high resistance state or if it is in its low resistance state. As technology has advanced the difference between the low resistance state and the high resistance state has reduced. Due to this reduction in resistance delta it has become more and more difficult to determine a programmed eFuse from and unprogrammed eFuse. To help mitigate this issue differential sense amplifiers have been incorporated into the eFuse design. However, known sense amplifiers are not without their own weaknesses and have several sensitivities to process variation.

A need exists for a circuit for implementing an enhanced eFuse sense amplifier. It is desirable to provide such an enhanced eFuse sense amplifier that limits sensitivities to process variation and accurately determines a high resistance state or low resistance state of an eFuse.

SUMMARY OF THE INVENTION

Principal aspects of the present invention are to provide a method and circuit for implementing an enhanced eFuse sense amplifier, and a design structure on which the subject circuit resides. Other important aspects of the present invention are to provide such a method and circuit for implementing an enhanced eFuse sense amplifier substantially without negative effect and that overcome many of the disadvantages of prior art arrangements.

In brief, a method and circuit for implementing an eFuse sense amplifier, and a design structure on which the subject circuit resides are provided. A sensing circuit includes a pair of cross-coupled inverters. Each of the pair of cross-coupled inverters is formed by a pair of series connected P-channel field effect transistors (PFETs) and an N-channel field effect transistor (NFET). A first pull-up resistor is coupled between a positive voltage supply rail and a first sensing node of the sensing circuit. A second pull-up resistor is coupled between a positive voltage supply rail and a second sensing node of the sensing circuit. A first bitline is coupled to the first sensing node of the sensing circuit and a second bitline coupled to the second sensing node of the sensing circuit. One of a respective reference resistor and a respective eFuse cell is selectively coupled to the first bitline and the second bitline.

In accordance with features of the invention, the method and circuit for implementing the enhanced eFuse sense amplifier provides improved tolerance to process variation, and reduces voltage threshold (Vt) scatter effect in the sense amplifier. The pair of series connected P-channel field effect transistors (PFETs) and the N-channel field effect transistor (NFET) are body-contacted devices. The first bitline and second bitline are balanced on each side of the sensing circuit reducing capacitive coupling and balancing leakage currents on the bitlines.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method and a circuit for implementing an enhanced eFuse sense amplifier are provided. The novel eFuse sense amplifier is arranged to limit the affect of process variation, Vt scatter, eFuse pre-blow resistance, and post-blow resistance on the sense amplifier.

Figure 1:
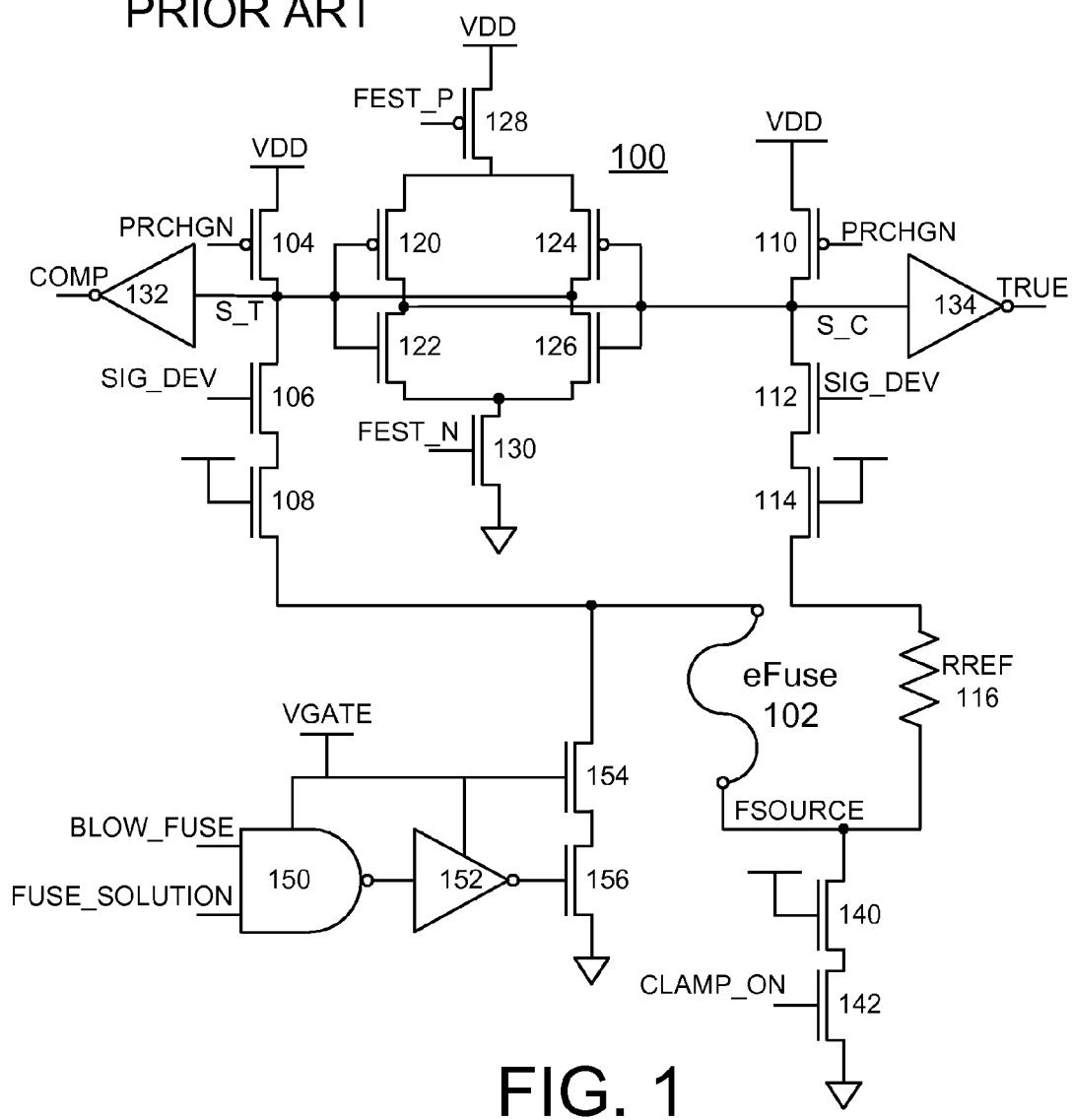
FIG. 1 illustrates a prior art sense amplifier used for an electronic fuse, or eFuse.
Figure 2A:
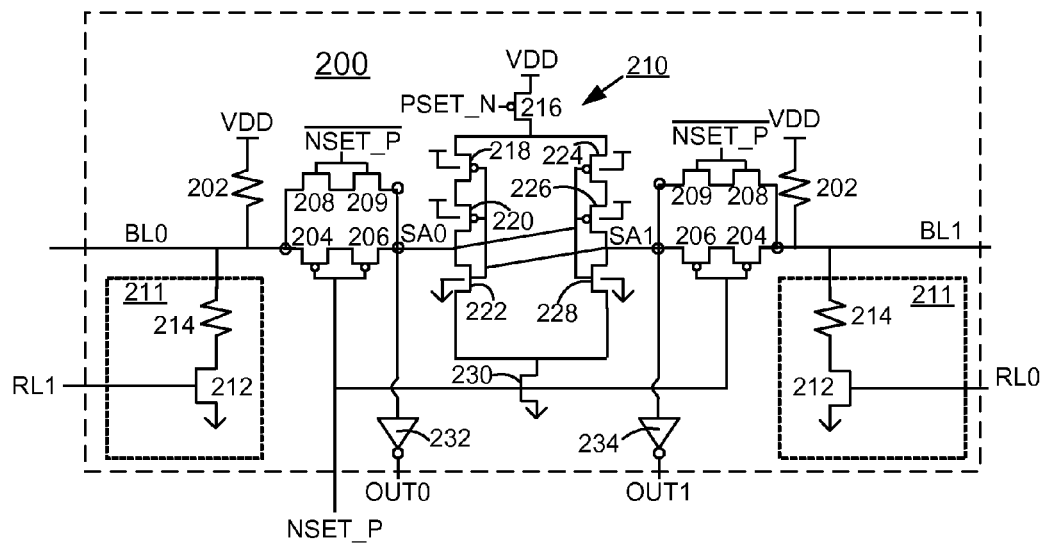
FIG. 2A is a schematic diagram illustrating an exemplary circuit for implementing an eFuse sense amplifier in accordance with the preferred embodiment.

Having reference now to the drawings, in FIG. 2A, there is shown an exemplary sense amplifier generally designated by the reference character 200 in accordance with the preferred embodiment.

Sense amplifier 200 includes a respective pull-up resistor 202 connected between a positive voltage supply rail VDD and a respective even and odd bitline BL0, BL1. The pull-up resistors 202 replace the precharge PFETs 104, 110 of the prior art sense amplifier 100 in order to eliminate the Vt scatter, process sensitivity, and VDD sensitivity introduced by the precharge PFETs. The pull-up resistors 202 have a tighter tolerance to process variation then a PFET. The pull-up resistors 202 also react linearly to VDD changes while the PFETs strength has an exponential relationship to VDD, and of course resistors do not have any Vt scatter as do PFETs.

Sense amplifier 200 includes a respective transmission gate defined by a parallel connected pair of series connected P-channel field effect transistors (PFETs) 204, 206 and pair of series connected N-channel field effect transistors (NFETs) 208, 209 connected to the respective even and odd bitline BL0, BL1 and a respective sensing node SA0, SA1 of a sensing circuit 210.

In accordance with features of the invention, the full transmission gate provided in the novel eFuse sense amplifier 200 improves the voltage head room at lower VDD operation with PFETs 204, 206 passing a high voltage into the sensing circuit 210. The transmission gate feeding into the sense amp was split into the series connected PFETs 204, 206, and NFETs 208, 209 in order to reduce the sensitivity to Vt scatter and to reduce the speed that the signal from the bit line is able to go into the sensing circuit 210 by adding resistance into the path. Reducing how quickly the sensing circuit 210 reacts to voltage differentials on the bit lines proved critical as it substantially eliminated sensitivity to capacitive coupling when the sensing circuit 210 is turned on.

Figure 2B:
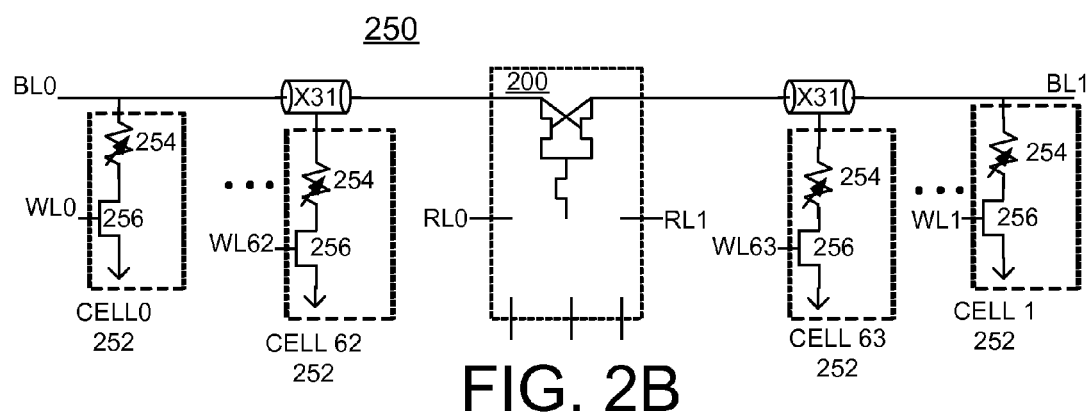
FIG. 2B illustrates an exemplary arrangement of eFuse cells with the eFuse sense amplifier circuit of FIG. 2A in accordance with the preferred embodiment.
Figure 3A:
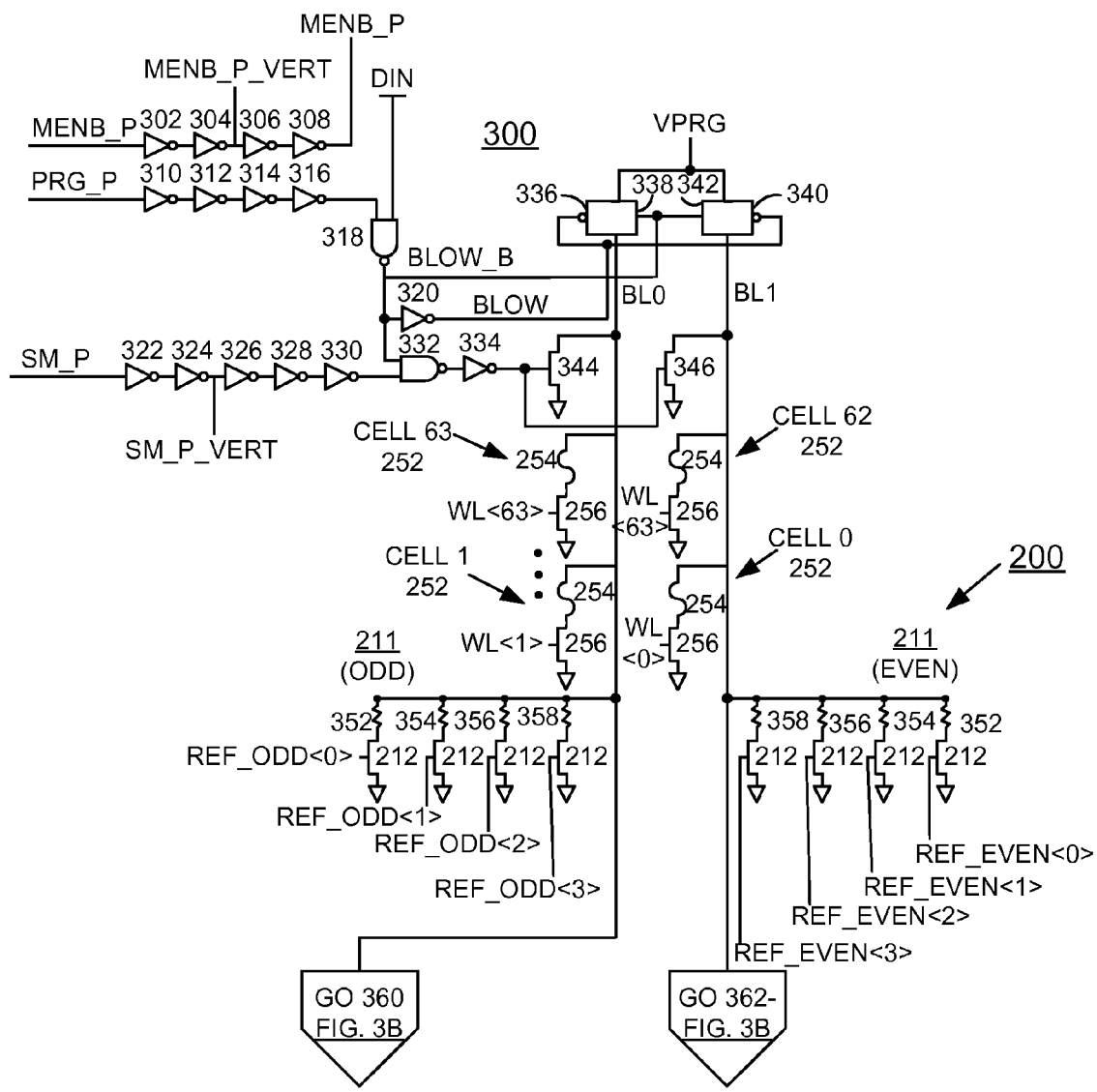
FIGS. 3A and 3B are schematic diagrams together illustrating an exemplary arrangement of the eFuse sense amplifier circuit of FIG. 2A in accordance with the preferred embodiment.

Sense amplifier 200 includes a programmable reference resistor circuit 211 connected to the even and odd bitline BL0, BL1 on each side of the sensing circuit 210. As shown in FIGS. 2A and 2B, a respective reference select signal is applied to a gate input of a respective select NFET 212 connected between ground and a respective reference resistor 214 connected to the respective even and odd bitline BL0, BL1. Each of the respective NFETs 212 receives a respective gate input RL0, or RL1, as shown. Each programmable reference resistor circuit 211 advantageously includes a plurality of reference resistors as shown in FIG. 3A, each having predetermined different resistance values. The respectively activated NFET 212 selects a particular reference resistor 214 having a predetermined reference resistor value, such as 1K ohm, 2K ohm, 4K ohm and 5K ohm.

Sensing circuit 210 includes a header PFET 216 connected between the voltage supply VDD and a pair of cross-coupled inverters connected to the sensing nodes SA0, SA1, as shown. A pair of series connected PFETs 218, 220 and an NFET 222, and a pair of series connected PFET 224, 226 and an NFET 228 respectively form the cross-coupled inverters. Sensing circuit 210 includes a pull-down NFET 230 connecting NFETs 222, 228 to ground. A respective inverter 232, 234 coupled to the respective sensing node SA0, SA1 drives a respective output OUT0, OUT1 of the sense amplifier 100.

In accordance with features of the invention, the PFETs 218, 220, 224, 226 and NFETs 222, 228 are body-contacted devices for removing SOI history effect from Vt-mismatch issue. Respective PFETs 218, and PFETs 220, 224, 226 are stacked enabling more robust function over Vt-variation effects.

Referring also to FIG. 2B, there is shown an exemplary eFuse array 250 of a 64-bit column of eFuse cells 0-63, 252 with the eFuse sense amplifier 200 of FIG. 2A in accordance with the preferred embodiment. The eFuse array 250 of a 64-bit column of fuse cells 0-63, 252 is balanced bitlines BL0, BL1 on each side of the sense amplifier 200, with 32 even fuse cells 252 per bitline BL0 from fuse cell 0, 252 to fuse cell 62, 303, and 32 odd fuse cells 252 per bitline BL1 from fuse cell 1, 252 to fuse cell 63, 252.

Each fuse cell 252 includes an eFuse 254 connected to the respective one of the even and odd bitlines BL0, BL1 and connected via a respective NFET 256 to ground. A respective wordline input WL0-WL63 is applied to a gate input of each NFET 256.

In accordance with features of the invention, the bit lines BL0, BL1 attached to the sense amplifier 200 are balanced with respect to each other. On each side of the sense amplifier 200 there is 32 eFuse cells and all of the programmable reference resistors 214. This also reduces otherwise capacitive coupling when the sense amplifier 200 turns on because substantially equal capacitances is provided on both sides of the sense amplifier 200. This additionally balances the leakage currents pulling on the bit lines BL0, BL1.

Figure 3B:
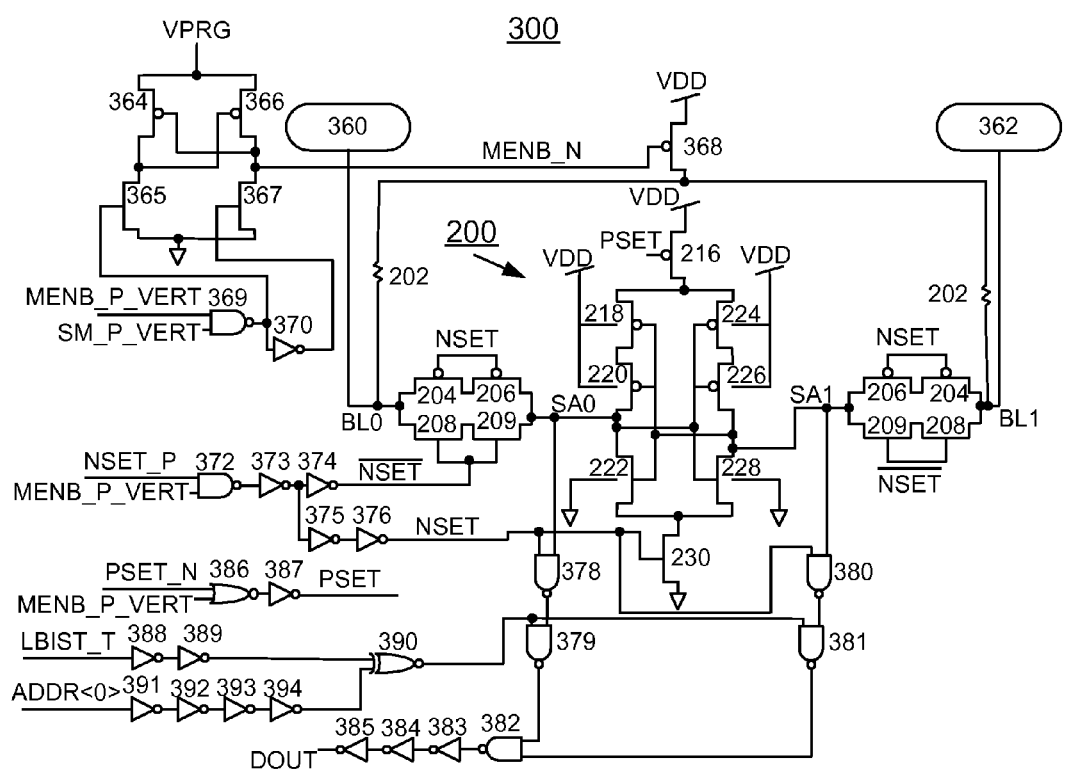

Referring also to FIGS. 3A and 3B, there is shown an exemplary arrangement 300 of the eFuse sense amplifier circuit 200 and the eFuse array 250 with fuse blow and control testing circuits in accordance with the preferred embodiment.

Referring now to FIG. 3A, a pair of macro enable fuse blow and control testing signals MENB_P and PRG_P is respectively applied to a string of inverters 302, 304, 306, 308 and 310, 312, 314, 316. A macro enable vertical signal MENB_P_VERT is provided at the output of inverter 304 and the testing signal MENB_P is provided at the output of inverter 308. The testing signal PRG_P output of inverter 316 is applied to an input of a NAND gate 318 with a fuse blow control signal DIN applied to another input of NAND gate 318. An inverted fuse blow signal BLOW_B is provided at the output of NAND gate 318 and is inverted by an inverter 320 providing fuse blow signal BLOW. A sense mode control-testing signal SM_P is applied to a string of inverters 322, 324, 326, 328, and 330 with a vertical signal SMB_P_VERT is provided at the output of inverter 324. An inverted sense mode control testing signal SM_P at the output of inverter 330 is applied to a first input of a NAND gate 332, with a second input connected to inverted fuse blow signal BLOW_B. An inverter 334 inverts the output of NAND gate 332.

A parallel-connected PFET 336 and NFET 338, and a parallel-connected PFET 340 and NFET 342 are connected between a program voltage supply rail VPRG and a respective bitline BL0, BL1. The fuse blow signal BLOW is applied to the gate input of PFETs 336, 340, and inverted fuse blow signal BLOW_B is applied to the gate input of NFETs 338, 342. The inverted output of NAND gate 332 at the output of inverter 334 is applied to a gate input of a pair of NFETs 344, 346 connected between a respective bitline BL0, BL1 and ground.

FIG. 3A illustrates the eFuse array 250 of a 64-bit column of eFuse cells 0-63, 252, balanced between the respective bitlines BL0, BL1, with each even an odd eFuse cells receiving a respective wordline input WL<0>-WL<63>. The even and odd programmable reference resistor circuits 211 each includes a plurality of reference resistors 352, 354, 356, 358, with an associated reference resistor select NFET 212 receiving a respective gate input and controlled by REF_ODD<0: 3> and REF_EVEN<0:3>, as shown.

In accordance with features of the invention, the plurality of selectable reference resistors 352, 354, 356, 358 allow tuning of the sense function of the sense amplifier 200. This allows changing the divider resistance that the selected eFuse 254 is compared against. The plurality of selectable reference resistors 352, 354, 356, 358 provides additional robustness for the sense amplifier 200.

Referring now to FIG. 3B, a sense amplifier 200 is shown connected between the respective bitlines BL0, BL1 at the connection points 360, 362. In FIG. 3B, the sense amplifier 200 includes the same reference numerals as used in FIG. 2A. A macro enable control signal MEMB_N is generated with a respective series connected PFETs 364 and NFET 365, and PFET 366 and NFET 367 is connected between the program voltage supply rail VPRG and ground with cross connected gates of PFETs 364, 366. A NAND gate 369 having inputs MENB_P_VERT and SM_P_VERT provides an output applied to a gate of NFET 365 and inverted by an inverter 370 and applied to a gate of NFET 367. The macro enable control signal MEMB_N is applied to a gate input of a header PFET 368. The header PFET 368 is connected between the pull-up resistors 202 of the sense amplifier 200 and the voltage supply rail VDD.

The NSET_P signal and control signal MENB_P_VERT are applied to respective inputs of a NAND gate 372. The output of NAND gate 372 is applied to a pair of series connected inverters 373, 374 to provide an inverted signal NSET and the output of inverter 373 is applied to a pair of series connected inverters 375, 377 to provide a signal NSET, which are applied to the respective transmission gate NFETs 208, 209 and PFETs 204, 206 on each side SA0, SA1 of the sensing circuit 210. The NSET signal is applied to the footer NFET 230 of the sense amplifier 200.

A data output DOUT of the sense amplifier 200 is provided with the first side SA0 of the sensing circuit 210 providing an input to a NAND gate 378 with a second input of the NSET signal applied to the NAND gate 378. The output of the NAND gate 378 is applied to an input of a NAND gate 379. The second side SA1 of the sensing circuit 210 provides an input to a NAND gate 380 with a second input of the NSET signal applied to the NAND gate 380. The output of the NAND gate 380 is applied to an input of a NAND gate 381. The respective outputs of NAND gates 379, 381 are applied to a NAND gate 382. A string of series connected inverters 383, 384, 385 are connected to the output of the NAND gate 382 providing the data output DOUT.

As shown in FIG. 3B, the PSET_N signal and control signal MENB_P_VERT are applied to respective inputs of an OR gate 386. The output of OR gate 386 is applied to an inverter 387 providing the PSET signal applied to the header PFET 216 of the sensing circuit 210.

A logic built in self test (LBIST) input signal LBIST_T is coupled by a pair of series connected inverters 388, 389 to an exclusive-OR gate 390, with an address signal ADDR <0> coupled by a string of series connected inverters 391, 392, 393, 394 to a second input of the exclusive OR gate 390. The output of exclusive-OR gate 390 is applied to the second input of the NAND gate 379 and the second input of the NAND gates 381. The input signal LBIST_T is used to force an output multiplexer function of sense amplifier 200 into the compliment state. This allows the testing of all the down stream logic because both true and compliment states can be read. This also allows the testing of all upstream logic by forcing both states into the logic stream.

Figure 4:
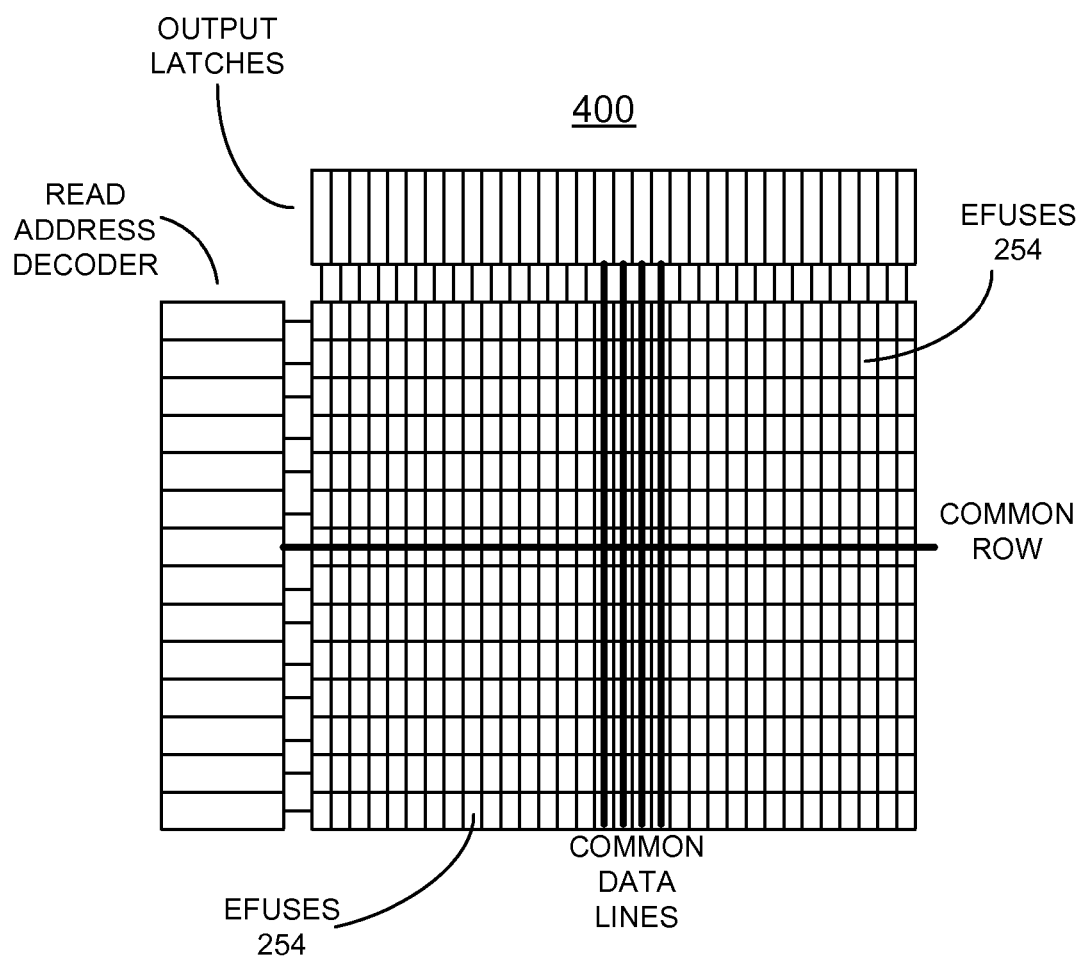
FIG. 4 illustrates an exemplary organization of an array structure in accordance with the preferred embodiment.

FIG. 4 illustrates an exemplary organization of the array structure 400. The eFuses 254 are oriented into an array structure 400. The array structure 400 improves the cell to peripheral circuits area ratio. The array structure 400 allows the sense amplifier 200 to be shared by multiple eFuse cells 252 instead of having one sense amplifier per eFuse cell.

Figure 5:
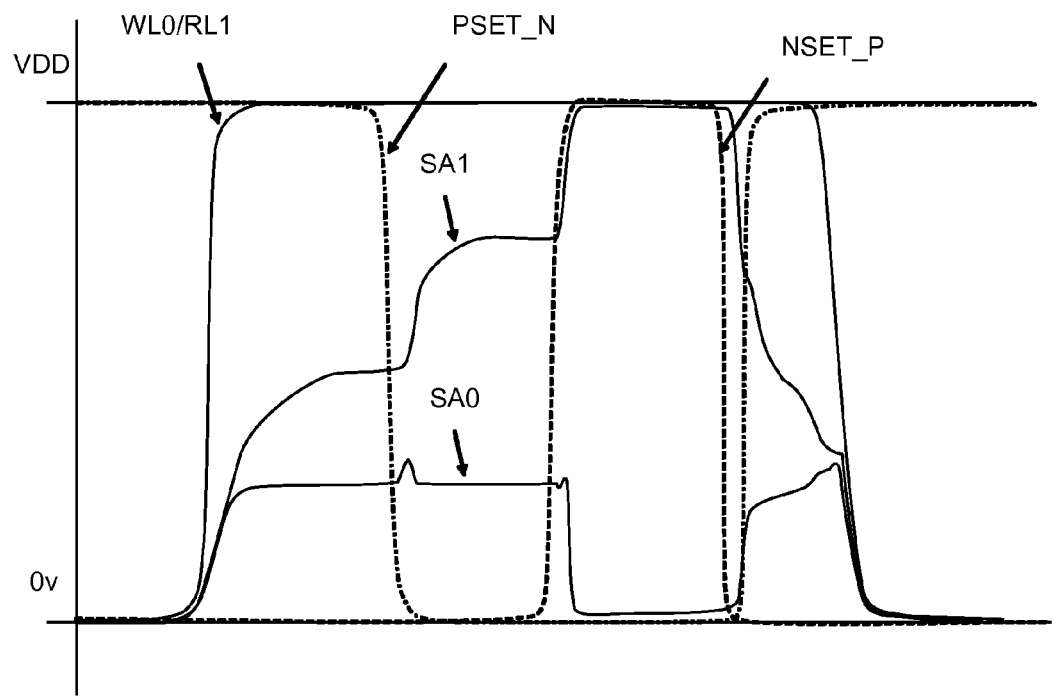
FIGS. 5 and 6 illustrate testing operation of the eFuse sense amplifier of FIG. 2A in accordance with the preferred embodiment.
Figure 6:
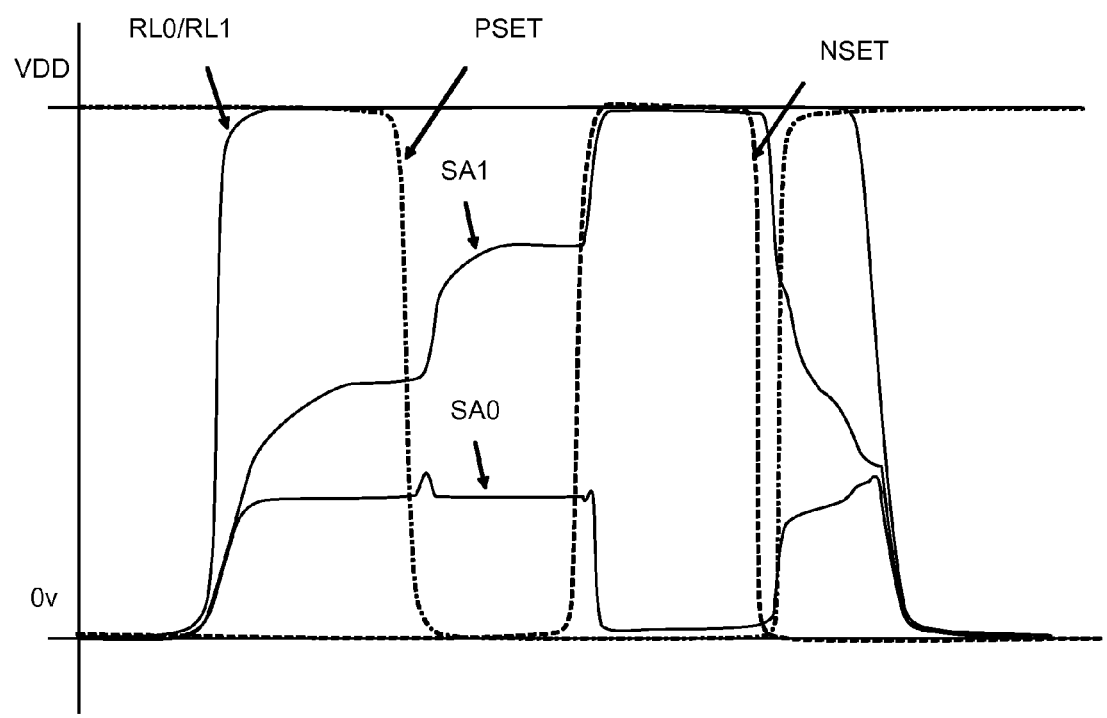

FIGS. 5 and 6 illustrate testing operation of the eFuse sense amplifier 200 as shown in FIGS. 2A, 2B, 3A, and 3B in accordance with the preferred embodiment.

Referring to FIG. 5, the input signals WL0 and RL1 go high to select the eFuse 254 coupled to bitline BL0 and a particular reference resistor 214. Then PSET_N signal as shown in FIGS. 2A, 2B, which is applied to header PFET 216 falls, turning on PFET 216 and the sense amplification process commences. The header PFET 216 is turned off with PSET_N signal ON and the transmission gate PFETs 204, 206 and NFETs 208, 209 are turned on with the NSET_P signal OFF, then are turned off with the NSET_P signal ON.

Referring to FIG. 6, the input signals RL0 and RL1 go high to select the reference resistor 214 coupled to the respective bitlines BL0, BL1 for forcing sensing circuit 210 to 0 and 1. A reference resistor for one side of the sensing circuit 210 is selected as the highest reference resistor available. A reference resistor for one side of the sensing circuit 210 is selected as the lowest reference resistor available. PSET signal as shown in FIGS. 3A, 3B, which is applied to header PFET 216 falls, turning on PFET 216 and the testing sense amplification process commences. The header PFET 216 is turned off with PSET signal ON and the transmission gate PFETs 204, 206 and NFETs 208, 209 are turned on with the NSET signal OFF, then are turned off with the NSET signal ON.

Figure 7:
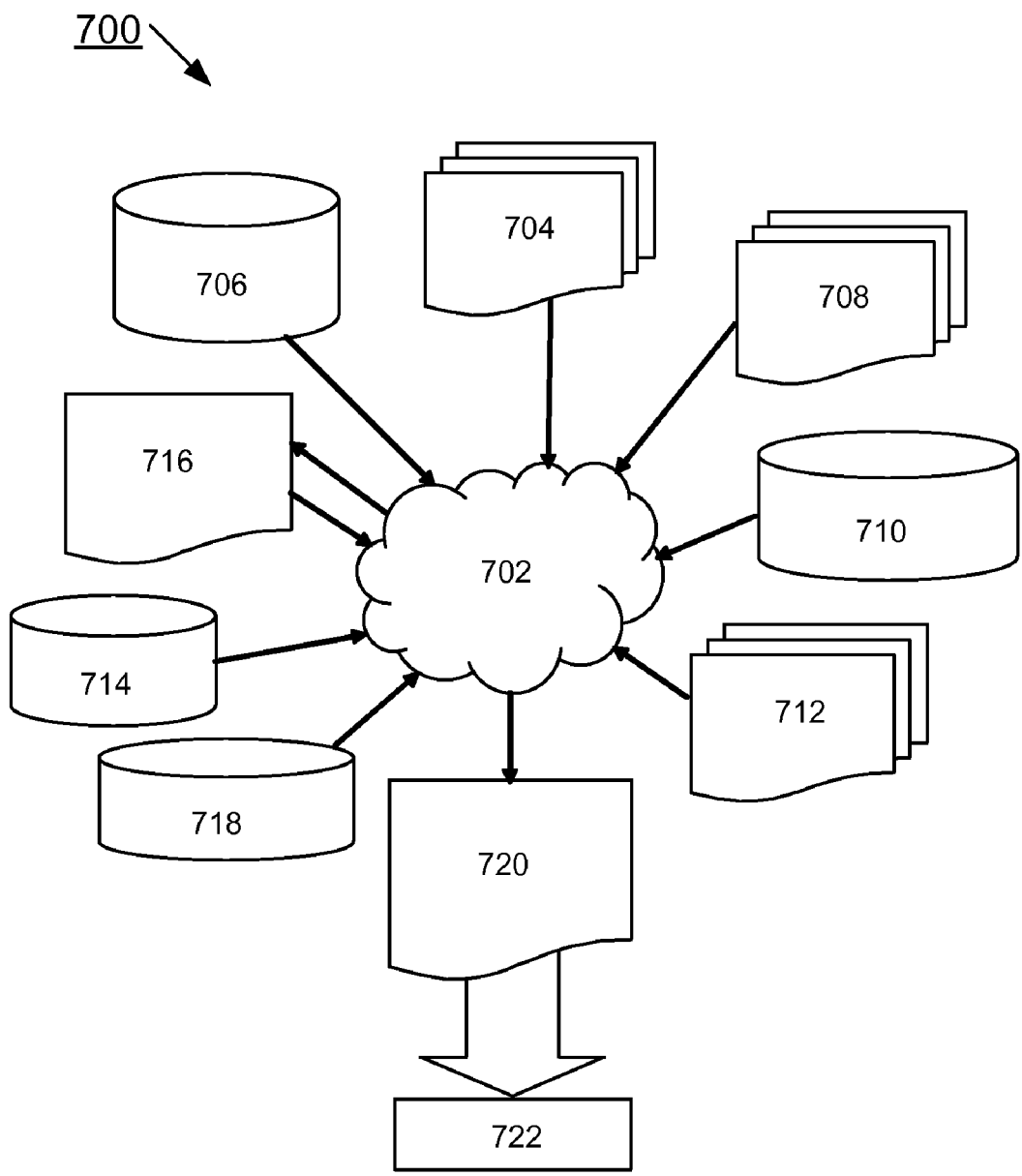
FIG. 7 is a flow diagram of a design process used in semiconductor design, manufacturing, and/or test.

FIG. 7 shows a block diagram of an example design flow 700. Design flow 700 may vary depending on the type of IC being designed. For example, a design flow 700 for building an application specific IC (ASIC) may differ from a design flow 700 for designing a standard component. Design structure 702 is preferably an input to a design process 704 and may come from an IP provider, a core developer, or other design company or may be generated by the operator of the design flow, or from other sources. Design structure 702 comprises circuit 200, 250, 300 in the form of schematics or HDL, a hardware-description language, for example, Verilog, VHDL, C, and the like. Design structure 702 may be contained on one or more machine readable medium. For example, design structure 702 may be a text file or a graphical representation of circuit 100. Design process 704 preferably synthesizes, or translates, circuit 200, 250, 300 into a netlist 706, where netlist 706 is, for example, a list of wires, transistors, logic gates, control circuits, I/O, models, etc. that describes the connections to other elements and circuits in an integrated circuit design and recorded on at least one of machine readable medium. This may be an iterative process in which netlist 706 is resynthesized one or more times depending on design specifications and parameters for the circuit.

Design process 704 may include using a variety of inputs; for example, inputs from library elements 708 which may house a set of commonly used elements, circuits, and devices, including models, layouts, and symbolic representations, for a given manufacturing technology, such as different technology nodes, 32 nm, 45 nm, 90 nm, and the like, design specifications 710, characterization data 712, verification data 714, design rules 716, and test data files 718, which may include test patterns and other testing information. Design process 704 may further include, for example, standard circuit design processes such as timing analysis, verification, design rule checking, place and route operations, and the like. One of ordinary skill in the art of integrated circuit design can appreciate the extent of possible electronic design automation tools and applications used in design process 704 without deviating from the scope and spirit of the invention. The design structure of the invention is not limited to any specific design flow.

Design process 704 preferably translates an embodiment of the invention as shown in FIGS. 2A, 2B, 3A and 3B along with any additional integrated circuit design or data (if applicable), into a second design structure 720. Design structure 720 resides on a storage medium in a data format used for the exchange of layout data of integrated circuits, for example, information stored in a GDSII (GDS2), GL1, OASIS, or any other suitable format for storing such design structures. Design structure 720 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 2A, 2B, 3A and 3B. Design structure 720 may then proceed to a stage 722 where, for example, design structure 720 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing an eFuse sense amplifier comprising:
a sensing circuit, said sensing circuit including a pair of cross coupled inverters; each of said pair of cross coupled inverters being formed by a pair of series connected P-channel field effect transistors (PFETs) and an N-channel field effect transistor (NFET);
a first pull-up resistor coupled between a positive voltage supply rail and a first sensing node of the sensing circuit;
a second pull-up resistor coupled between a positive voltage supply rail and a second sensing node of the sensing circuit;
a first bitline coupled to said first sensing node of the sensing circuit;
a second bitline coupled to said second sensing node of the sensing circuit; and
a respective reference resistor and a respective eFuse cell selectively coupled to said first bitline and said second bitline.

2. The circuit for implementing an eFuse sense amplifier as recited in claim 1 includes a first transmission gate selectively connecting said first bitline and said first sensing node of the sensing circuit, and a second transmission gate selectively connecting said second bitline said second sensing node of the sensing circuit.

3. The circuit for implementing an eFuse sense amplifier as recited in claim 2 wherein each of said first transmission gate and said second transmission gate includes a pair of series connected transmission gate PFETs connected in parallel with a pair of series connected transmission gate NFETs.

4. The circuit for implementing an eFuse sense amplifier as recited in claim 1 wherein said pair of series connected P-channel field effect transistors (PFETs) are body-contacted devices.

5. The circuit for implementing an eFuse sense amplifier as recited in claim 1 wherein each said respective eFuse cell includes a series connected eFuse and a select transistor.

6. The circuit for implementing an eFuse sense amplifier as recited in claim 5 wherein a wordline select signal is applied to a gate input of said select transistor.

7. The circuit for implementing an eFuse sense amplifier as recited in claim 6 wherein said first bitline and said second bitline are a balanced pair of bitlines including a plurality of eFuse cells connected to each of said first bitline and said second bitline.

8. The circuit for implementing an eFuse sense amplifier as recited in claim 1 wherein said first bitline and said second bitline are a balanced pair of bitlines including a set of said reference resistors connected to each of said first bitline and said second bitline.

9. The circuit for implementing an eFuse sense amplifier as recited in claim 1 wherein an eFuse voltage divider is defined by one of said first pull-up resistor or said second pull-up resistor; and a reference resistor voltage divider is defined by another one of said first pull-up resistor or said second pull-up resistor.

10. A method for implementing an eFuse sense amplifier comprising the steps of:
defining a sensing circuit by a pair of cross coupled inverters and forming each of said pair of cross coupled inverters by a pair of series connected P-channel field effect transistors (PFETs) and an N-channel field effect transistor (NFET);
coupling a first pull-up resistor between a positive voltage supply rail and a first sensing node of the sensing circuit;
coupling a second pull-up resistor coupled between a positive voltage supply rail and a second sensing node of the sensing circuit;
coupling a first bitline to said first sensing node of the sensing circuit;
coupling a second bitline to said second sensing node of the sensing circuit; and selectively coupling one of a respective reference resistor and a respective eFuse cell to said first bitline and said second bitline.

11. The method for implementing an eFuse sense amplifier as recited in claim 10 includes providing a first transmission gate selectively connecting said first bitline and said first sensing node of the sensing circuit, and providing a second transmission gate selectively connecting said second bitline said second sensing node of the sensing circuit; forming each of said first transmission gate and said second transmission gate by a pair of series connected transmission gate PFETs connected in parallel with a pair of series connected transmission gate NFETs.

12. The method for implementing an eFuse sense amplifier as recited in claim 10 includes providing a balanced pair of said first bitline and said second bitline.

13. The method for implementing an eFuse sense amplifier as recited in claim 10 includes connecting a plurality of eFuse cells to each of said first bitline and said second bitline.

14. The method for implementing an eFuse sense amplifier as recited in claim 10 includes connecting a set of said reference resistors to each of said first bitline and said second bitline.

15. A design structure embodied in a machine readable medium used in a design process, the design structure comprising:
a sensing circuit, said sensing circuit including a pair of cross coupled inverters; each of said pair of cross coupled inverters being formed by a pair of series connected P-channel field effect transistors (PFETs) and an N-channel field effect transistor (NFET);
a first pull-up resistor coupled between a positive voltage supply rail and a first sensing node of the sensing circuit;
a second pull-up resistor coupled between a positive voltage supply rail and a second sensing node of the sensing circuit;
a first bitline coupled to said first sensing node of the sensing circuit;
a second bitline coupled to said second sensing node of the sensing circuit; and
a respective reference resistor and a respective eFuse cell selectively coupled to said first bitline and said second bitline.

16. The design structure of claim 15, wherein the design structure comprises a netlist, which describes the circuit.

17. The design structure of claim 15, wherein the design structure resides on storage medium as a data format used for the exchange of layout data of integrated circuits.

18. The design structure of claim 15, wherein the design structure includes at least one of test data files, characterization data, verification data, or design specifications.

19. The design structure of claim 15, includes a first transmission gate selectively connecting said first bitline and said first sensing node of the sensing circuit, and a second transmission gate selectively connecting said second bitline said second sensing node of the sensing circuit.

20. The design structure of claim 15, wherein said first bitline and said second bitline are a balanced pair of bitlines including a plurality of eFuse cells connected to each of said first bitline and said second bitline.

* * * * *